United States Patent [19]
Shigehara et al.

[11] Patent Number: 5,382,846
[45] Date of Patent: Jan. 17, 1995

[54] LEVEL SHIFTING CIRCUIT FOR SUPPRESSING OUTPUT AMPLITUDE

[75] Inventors: Hiroshi Shigehara, Tokyo; Masanori Kinugasa, Yokohama, both of Japan

[73] Assignee: Kabushiki Kaisha Toshiba, Kawasaki, Japan

[21] Appl. No.: 988,971

[22] Filed: Dec. 10, 1992

[30] Foreign Application Priority Data

Dec. 13, 1991 [JP] Japan .................. 3-329305

[51] Int. Cl.[6] ........................ H03K 19/0175
[52] U.S. Cl. ........................ 326/68; 326/112; 326/121
[58] Field of Search ............ 307/448, 451, 475

[56] References Cited
U.S. PATENT DOCUMENTS

| | | | |
|---|---|---|---|
| 4,704,547 | 11/1987 | Kirsch | 307/451 |
| 4,730,132 | 3/1988 | Watanabe et al. | 307/448 |
| 4,882,534 | 11/1989 | Koshizuka | 307/448 |
| 5,057,715 | 10/1991 | Larsen | 307/451 |
| 5,191,244 | 3/1993 | Runaldue | 307/475 |

*Primary Examiner*—Edward P. Westin
*Assistant Examiner*—Andrew Sanders
*Attorney, Agent, or Firm*—Banner, Birch, McKie and Beckett

[57] ABSTRACT

The source-drain paths of first and second N-channel MOS transistors are series-connected between a first node to which a first power source voltage is applied and a second node to which a ground voltage is applied. The gate of the first MOS transistor is supplied with an input signal and the gate of the second MOS transistor is supplied with a signal obtained by inverting the input signal by means of a CMOS inverter. The inverter is supplied with a second power source voltage which is independent from the first power source voltage as an operation power source voltage.

9 Claims, 15 Drawing Sheets

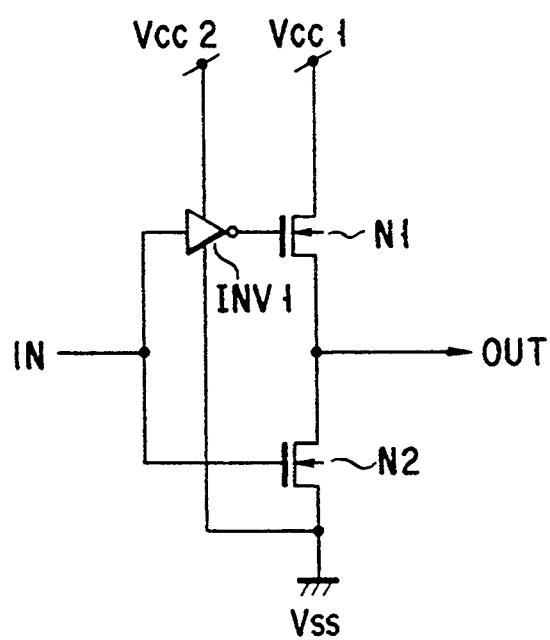
F I G. 4

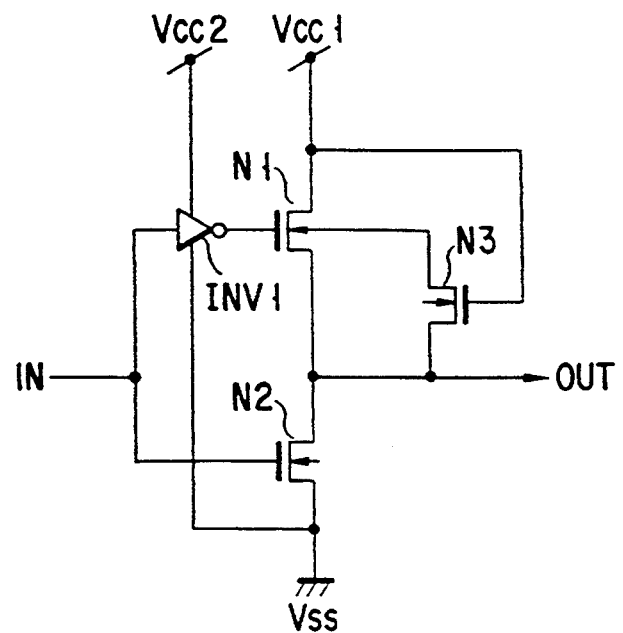
F I G. 6
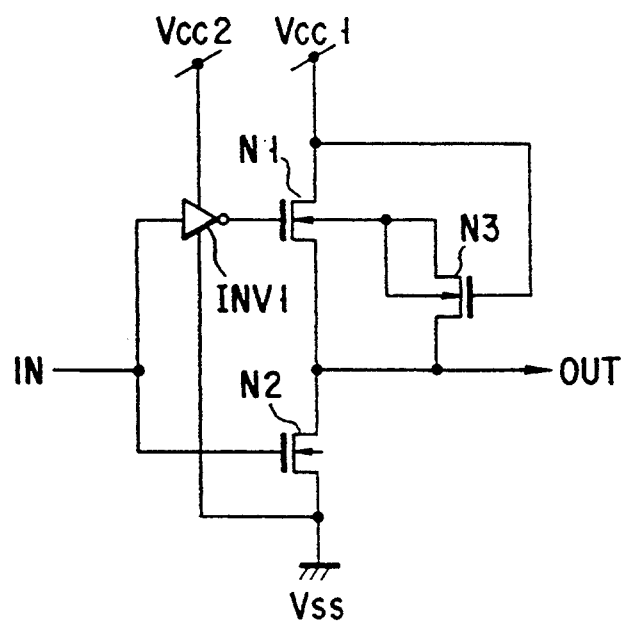
F I G. 7

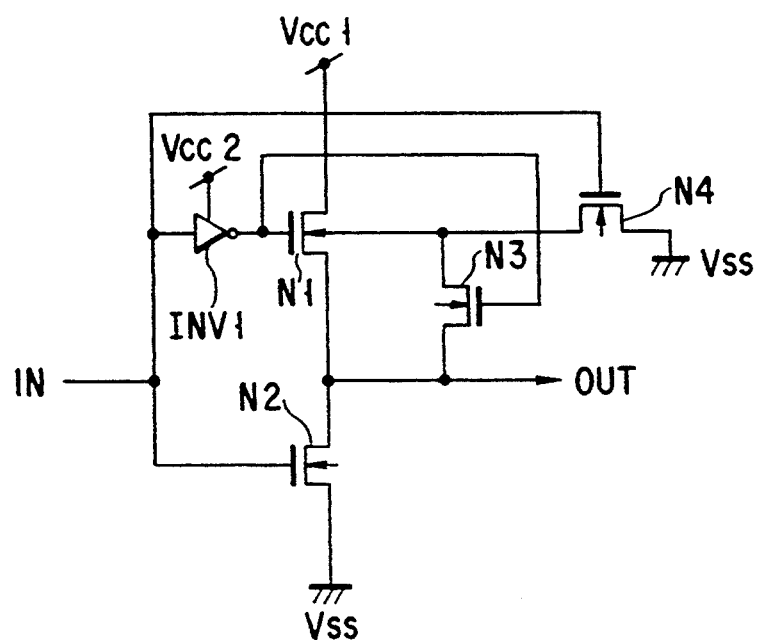
F I G. 8
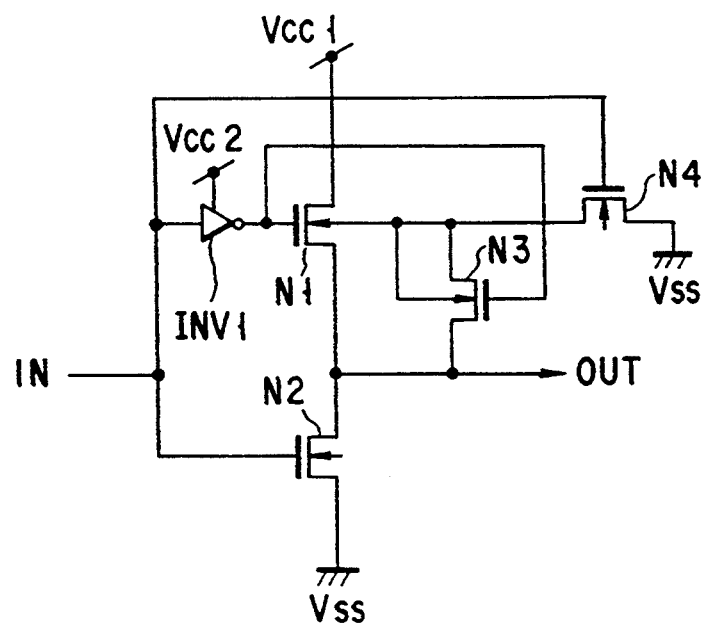
F I G. 9

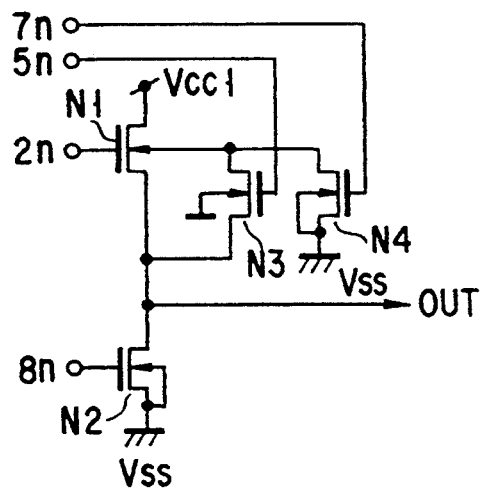
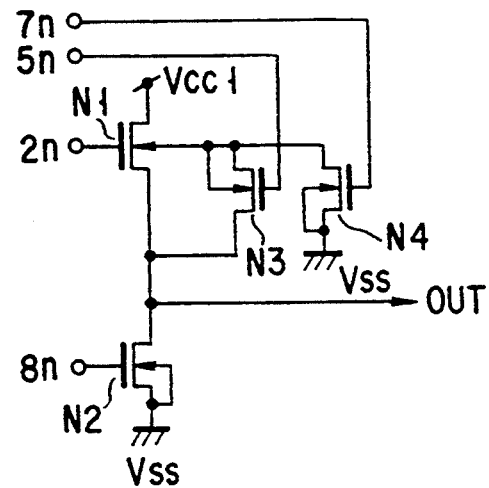
F I G. 10A       F I G. 10B
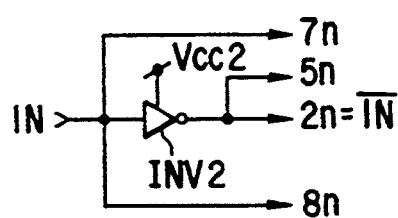
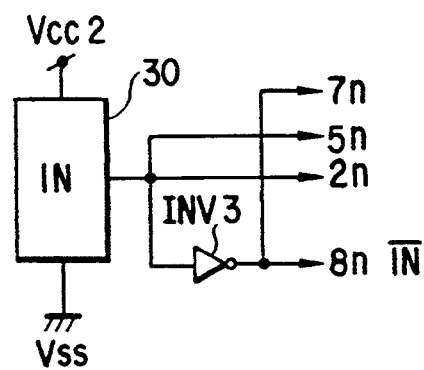
F I G. 11A       F I G. 11B

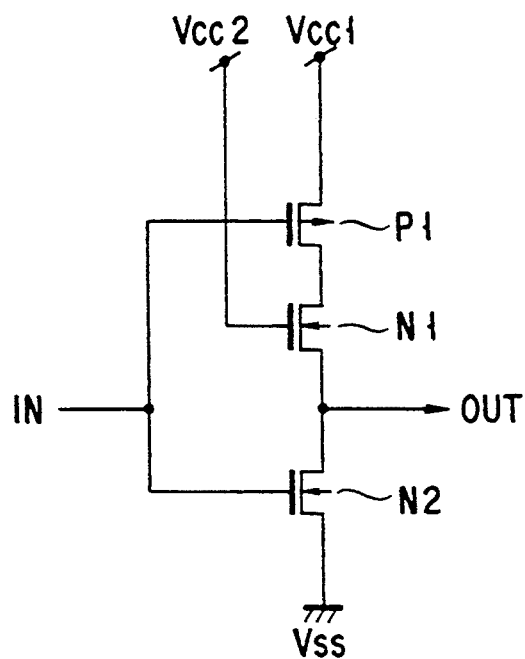
FIG. 14
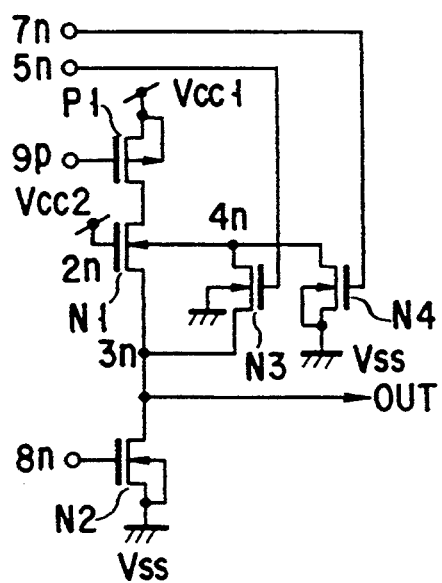   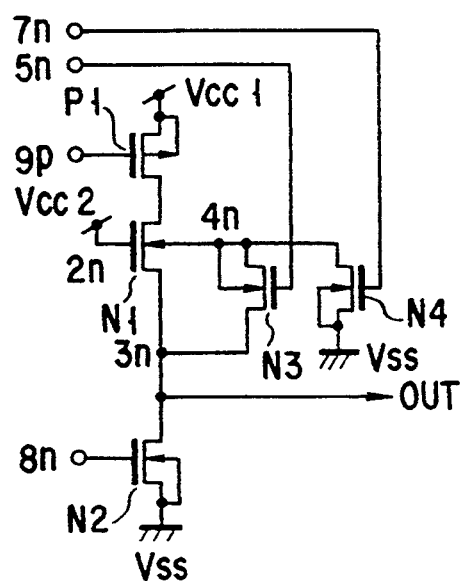
FIG. 15A          FIG. 15B

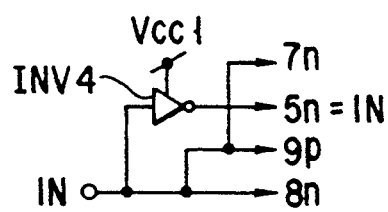 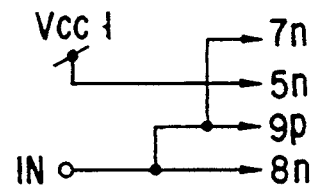
FIG. 16A	FIG. 16B
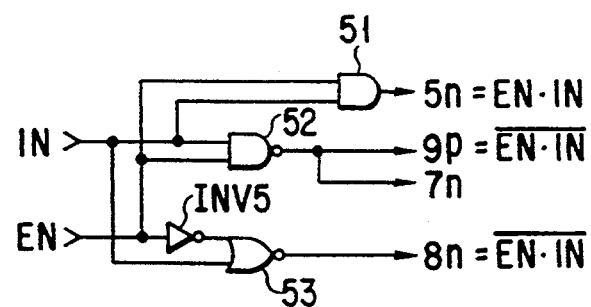
FIG. 17

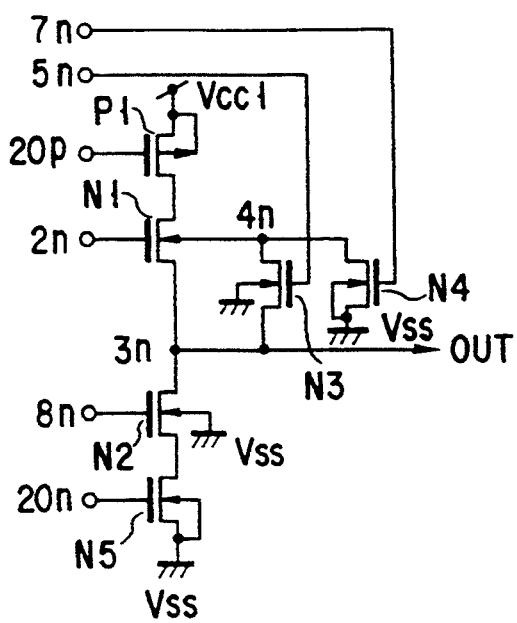
F I G. 18A
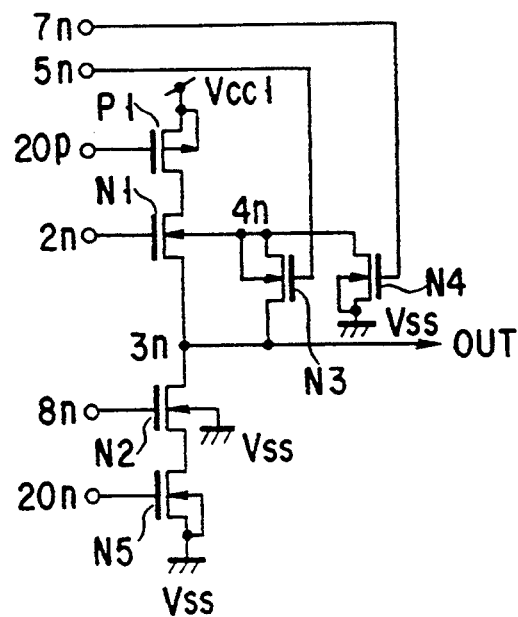
F I G. 18B
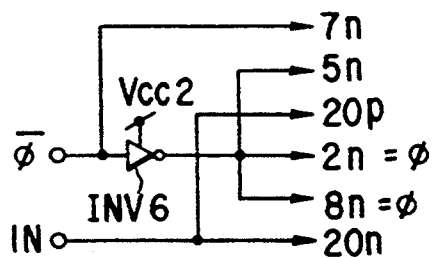
F I G. 19A
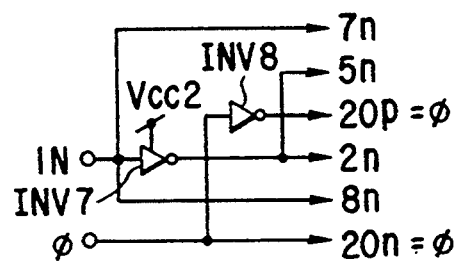
F I G. 19B

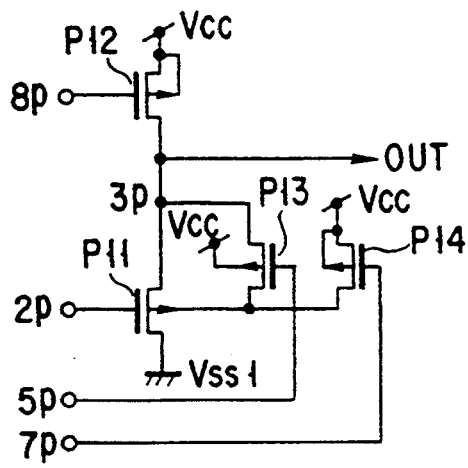
F I G. 20A
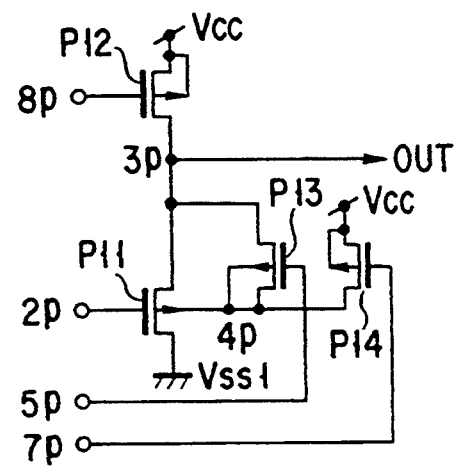
F I G. 20B
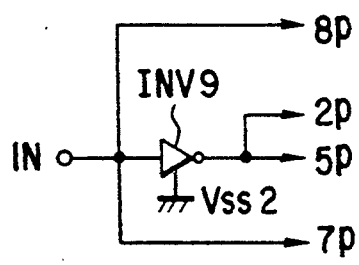
F I G. 21A
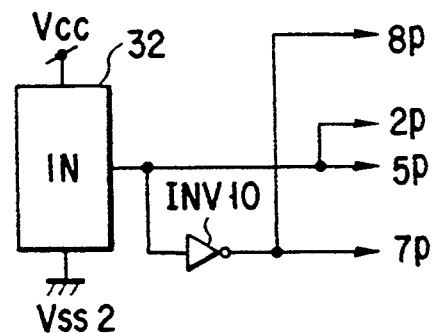
F I G. 21B

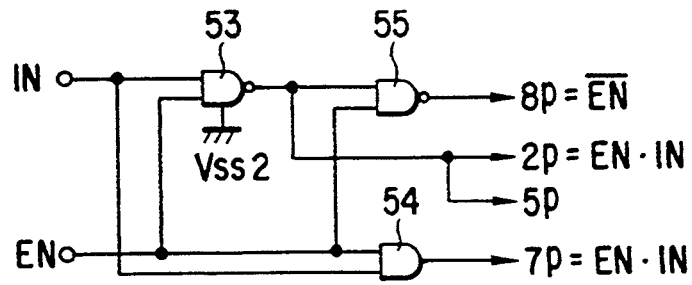
F I G. 22A
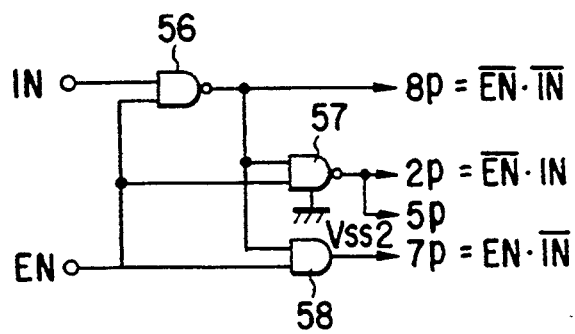
F I G. 22B
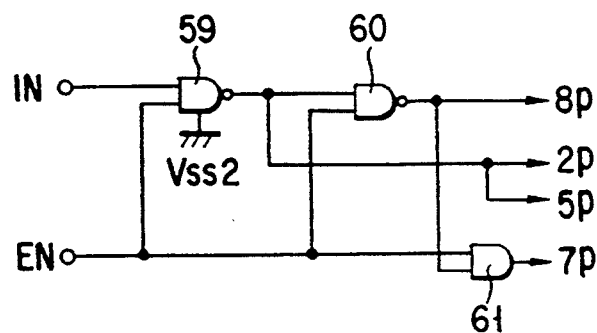
F I G. 23

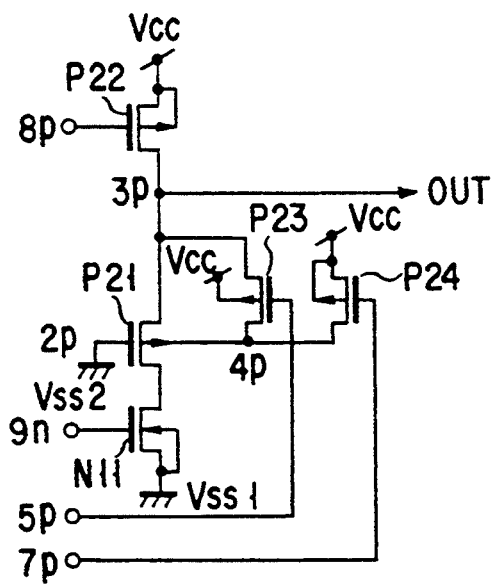
F I G. 24A
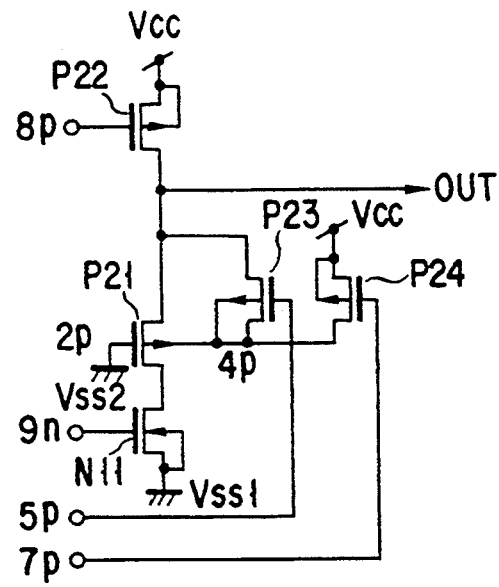
F I G. 24B
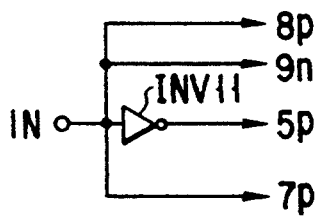
F I G. 25A
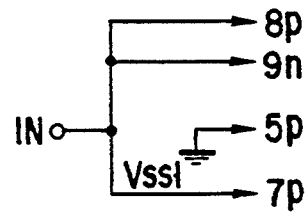
F I G. 25B

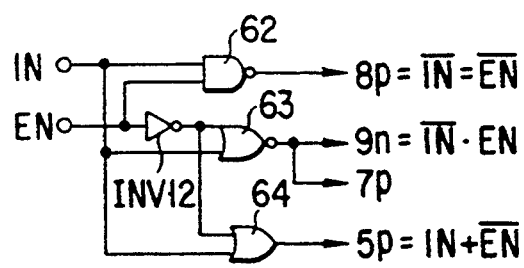
F I G. 26
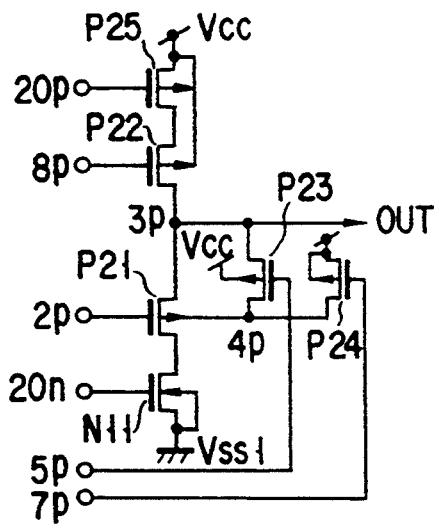
F I G. 27A
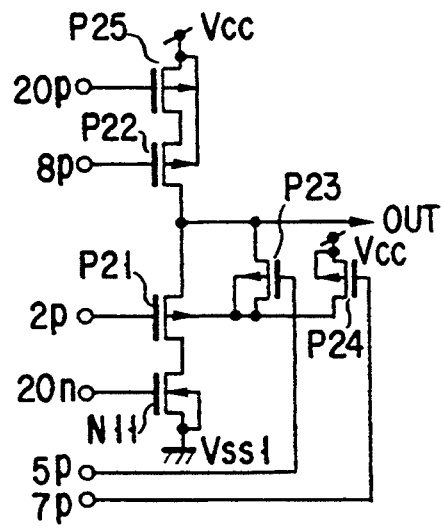
F I G. 27B
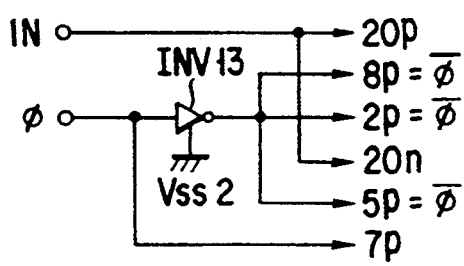
F I G. 28A
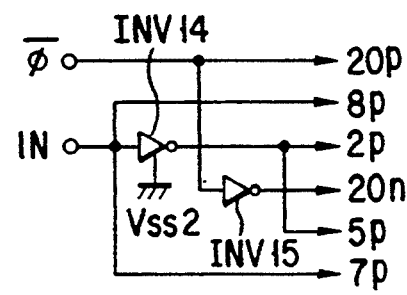
F I G. 28B

LEVEL SHIFTING CIRCUIT FOR SUPPRESSING OUTPUT AMPLITUDE

BACKGROUND OF THE INVENTION

1. Field of the Invention

This invention relates to a level shifting circuit constructed by MOS transistors, and more particularly, to a level shifting circuit in which the amplitude of an output signal is prevented from being fully swung to the power source voltage.

2. Description of the Related Art

FIG. 1 shows the construction of a conventional level shifting circuit for shifting the amplitude of a CMOS logic level signal to a lower level. For example, this type of level shifting circuit is disclosed in FIG. 1 of Published Unexamined Japanese Patent Application No. 55-146965. In the level shifting circuit of FIG. 1, the drain-source path of an N-channel MOS transistor N1 is connected between a power source node applied with a positive-side power source voltage Vcc and an output terminal and the drain-source path of an N-channel MOS transistor N2 is connected between the output terminal and a power source node applied with a ground voltage Vss. The gate of the N-channel MOS transistor N2 is supplied with an input signal IN and the gate of the N-channel MOS transistor N1 is supplied with a signal obtained by inverting the input signal IN by means of a CMOS inverter INV1. Both of the N-channel MOS transistors N1 and N2 are of enhancement type.

When an input signal IN of "H" level is input to the above level shifting circuit, the MOS transistor N1 is turned off and the MOS transistor N2 is turned on so that an output signal OUT will be set to an "L" level. The "L" level of the output signal OUT obtained at this time is a ground level. When the input signal IN of "L" level is input, the MOS transistor N1 is turned on and the MOS transistor N2 is turned off so that the output signal OUT will be set to an "H" level. At this time, the "H" level of the output signal OUT is not raised to the power source voltage Vcc and is set to a level "Vcc-VthN1" obtained by subtracting the threshold voltage VthN1 of the N-channel MOS transistor N1 from the power source voltage Vcc. Thus, in the level shifting circuit of FIG. 1, the "H" level side is shifted to a lower level.

FIG. 2 shows a general layout obtained when the circuit of FIG. 1 is set in a package as a semiconductor integrated circuit. A semiconductor integrated circuit (chip) 12 is mounted on a bed 11 of a lead frame by die bonding. P-channel and N-channel MOS transistors 13 and 14 constructing the inverter INV1, an internal metal wiring 15 for supplying the power source voltage Vcc to the MOS transistors N1 and 13, an internal metal wiring 16 for supplying the ground voltage Vss to the MOS transistors N2 and 14, bonding pads 17-1 to 17-4 and the like are formed in the chip 12. The bonding pads 17-1 to 17-4 are respectively connected to inner leads 19-1 to 19-4 of the lead frame via boding wires 18-1 to 18-4.

As shown in FIG. 2, the drain of the MOS transistor N1 is connected to the source of the P-channel MOS transistor 13 of the inverter INV1 via the wiring 15 in the semiconductor integrated circuit, and therefore, the potentials of the drain of the MOS transistor N1 and the source of the MOS transistor 13 are set substantially equal to each other. As a result, a variation in the potential occurring in one of the drain and source gives an influence to the other of the drain and source. Then, the following problem occurs in the conventional circuit.

Assume now that the output signal voltage VOUT is set at the Vss level (which is hereinafter referred to as an "L" level) in the initial condition, that is, when the input signal voltage VIN is set at the Vcc level (which is hereinafter referred to as an "H" level). At this time, the potential at the output node of the inverter INV1 is set at the "L" level, the MOS transistor N1 is set in the OFF state and the MOS transistor N2 is set in the ON state. Therefore, the output signal VOUT is set to the "L" level.

When the voltage VIN is switched from the "H" level to the "L" level, the conduction state of the MOS transistor N1 is changed from the OFF state to the ON state and the conduction state of the MOS transistor N2 is changed from the ON state to the OFF state. AS a result, a current for driving a load (not shown) connected to the output terminal flows into the current path of the MOS transistor N1. At this time, a voltage variation of L(di/dt) occurs in the drain of the MOS transistor N1 as shown in FIG. 3 by the current variation rate di/dt and an inductance component (parasitic inductance components associated with the internal metal wiring 15, bonding wire 18-1, inner lead 19-1 and the like) L associated with the Vcc line (internal metal wiring 15). That is, a potential bounce occurs in the Vcc line. The potential bounce is transmitted to the output node of the inverter INV1 via the internal metal wiring 15 so that a bounce may occur in the gate potential of the MOS transistor N1.

When the gate potential bounce is not taken into consideration, the output signal voltage VOUT may be raised to "Vcc-VthN1" as describe before and then set to a constant level. The voltage is indicated by broken lines in FIG. 3. However, when the gate potential bounce is taken into consideration, the output signal voltage VOUT set when the output signal OUT is at "H" level becomes larger than "Vcc-VthN1" by an amount Δ under the influence of a potential bounce causing the power source voltage Vcc to exceed the Vcc level. At this time, even if the potential bounce in the power source voltage Vcc becomes lower than Vcc, the output level will not be lowered. This is because the relation "Vcc-VOUT<VthN1" is set up. Thus, if the power source voltage Vcc is set to be higher than the Vcc level to which the power source voltage Vcc will be originally set and VOUT is raised by an amount Δ, VOUT is kept set at a raised level even after the power source voltage Vcc is returned to the original voltage level.

If a large number of level shifting circuits having the same construction as the above shifting circuit are formed in a semiconductor integrated circuit, the number of circuits whose outputs are switched increases and L(di/dt) becomes extremely large, the output amplitude becomes larger and may sometimes reach Vcc. Then, a problem that the level-down operation which is the initial purpose cannot be attained occurs. Thus, in the conventional level shifting circuit, there occurs a problem that the potential bounce occurs in the power source line and the upper limit of the output amplitude level cannot be controlled.

The level shifting circuit of FIG. 1 is constructed by the N-channel MOS transistors and the "H" level of the output amplitude is shifted down to "Vcc-VthN1", but the same problem occurs when the level shifting circuit is constructed by P-channel MOS transistors and the "L" level of the output amplitude is shifted up to |VthP| (|VthP| is the absolute value of the threshold voltage of the P-channel MOS transistor). That is, in this case, a problem of undershoot occurs when the output signal is switched from the "H" level to the "L" level, thereby causing a bounce to occur in the ground potential.

SUMMARY OF THE INVENTION

Accordingly, an object of this invention is to provide a level shifting circuit for suppressing the overshoot and undershoot of an output and stably suppresses the output amplitude.

The above object can be attained by a level shifting circuit comprising a first MOS transistor which has a current path connected between a first power source node supplied with a first power source voltage and an output terminal and whose conduction state is controlled according to a first signal; a second MOS transistor which has a current path connected between a second power source node supplied with a second power source voltage and an output terminal, which is of the same channel type as the first MOS transistor and whose conduction state is controlled according to a second signal; and a logic circuit receiving one of the first and second power source voltages as one power source voltage and a third power source voltage independent from the first and second power source voltages as the other power source voltage, for creating the second signal based on the first signal.

Further, the above object can be attained by a level shifting circuit comprising a first MOS transistor of first channel type which has a current path connected between a first power source node supplied with a first power source voltage and an output terminal and whose conduction state is controlled according to an input signal; a second MOS transistor of second channel type which has a current path connected at one end to a second power source node supplied with a second power source voltage and whose conduction state is controlled according to the input signal; and a third MOS transistor of the first channel type having a current path connected between the other end of the current path of the second MOS transistor and the output terminal and a gate connected to a third power source node which is supplied with a third power source voltage independent from the second power source voltage.

In the former level shifting circuit, one of the first and second power source voltages is supplied as one of the two power source voltages of the logic circuit for creating the second signal based on the first signal and the third power source voltage which is independent from the first and second power source voltages is supplied as the other power source voltage so that the third power source voltage will not be influenced even if a potential bounce occurs in the first or second power source voltage. Therefore, the overshoot and undershoot of an output can be controlled.

In the latter level shifting circuit, since the third power source voltage which is independent from the second power source voltage is applied to the gate of the third MOS transistor, the overshoot and undershoot of an output can be controlled even when the second MOS transistor is turned on and a potential bounce occurs in the second power source node.

Thus, a level shifting circuit for suppressing the overshoot and undershoot of an output and stably suppressing the output amplitude can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a circuit diagram showing a level shifting circuit according to a first embodiment of this invention;

FIGS. 6 to 9 are circuit diagrams of modifications of the circuit of the embodiment shown in FIG. 4;

FIGS. 10A and 10B are circuit diagrams showing other modifications of the circuit of the embodiment shown in FIG. 4;

FIGS. 11A and 11B are circuit diagrams showing examples of the constructions of input circuits used for the circuits shown in FIGS. 10A and 10B;

FIG. 14 is a circuit diagram showing a level shifting circuit according to a second embodiment of this invention;

FIGS. 15A and 15B are circuit diagrams showing modifications of the circuit of the embodiment shown in FIG. 14;

FIGS. 16A and 16B are circuit diagrams showing examples of the constructions of input circuits used for the circuits shown in FIGS. 15A and 15B;

FIG. 17 is a circuit diagram showing another example of the construction of an input circuit used for the circuits shown in FIGS. 15A and 15B;

FIGS. 18A and 18B are circuit diagrams showing other modifications of the circuit of the embodiment shown in FIG. 14;

FIGS. 19A and 19B are circuit diagrams showing examples of the constructions of input circuits used for the circuits shown in FIGS. 18A and 18B;

FIGS. 20A and 20B are circuit diagrams showing other modifications of the circuit of the embodiment shown in FIG. 4;

FIGS. 21A and 21B are circuit diagrams showing examples of the constructions of input circuits used for the circuits shown in FIGS. 20A and 20B;

FIGS. 22A and 22B are circuit diagrams showing other examples of the constructions of input circuits used for the circuits shown in FIGS. 20A and 20B;

FIG. 23 is a circuit diagram showing still another example of the construction of an input circuit used for the circuits shown in FIGS. 20A and 20B;

FIGS. 24A and 24B are circuit diagrams showing still other modifications of the circuit of the embodiment shown in FIG. 14;

FIGS. 25A and 25B are circuit diagrams showing other examples of the constructions of input circuits used for the circuits shown in FIGS. 24A and 24B;

FIG. 26 is a circuit diagram showing another example of the construction of an input circuit used for the circuits shown in FIGS. 24A and 24B;

FIGS. 27A and 27B are circuit diagrams showing other modifications of the circuit of the embodiment shown in FIG. 14; and FIGS. 28A and 28B are circuit diagrams showing examples of the constructions of input circuits used for the circuits shown in FIGS. 27A and 27B.

DETAILED DESCRIPTION OF THE PREFERRED EMBODIMENT

Figure 1:
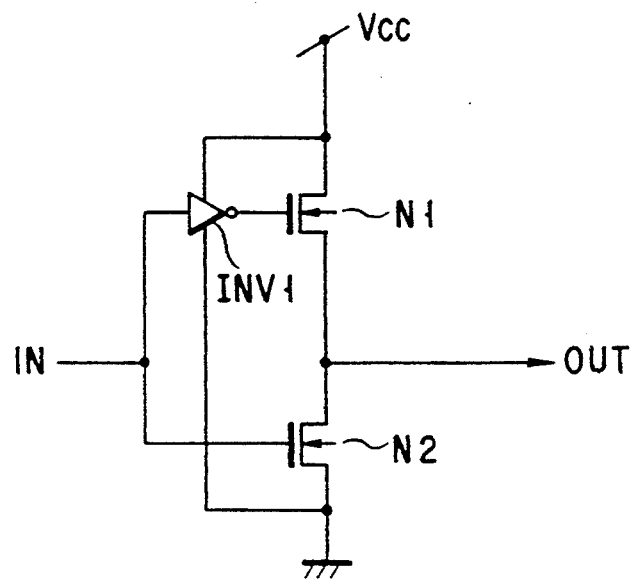
FIG. 1 is a circuit diagram showing the conventional level shifting circuit.
Figure 2:
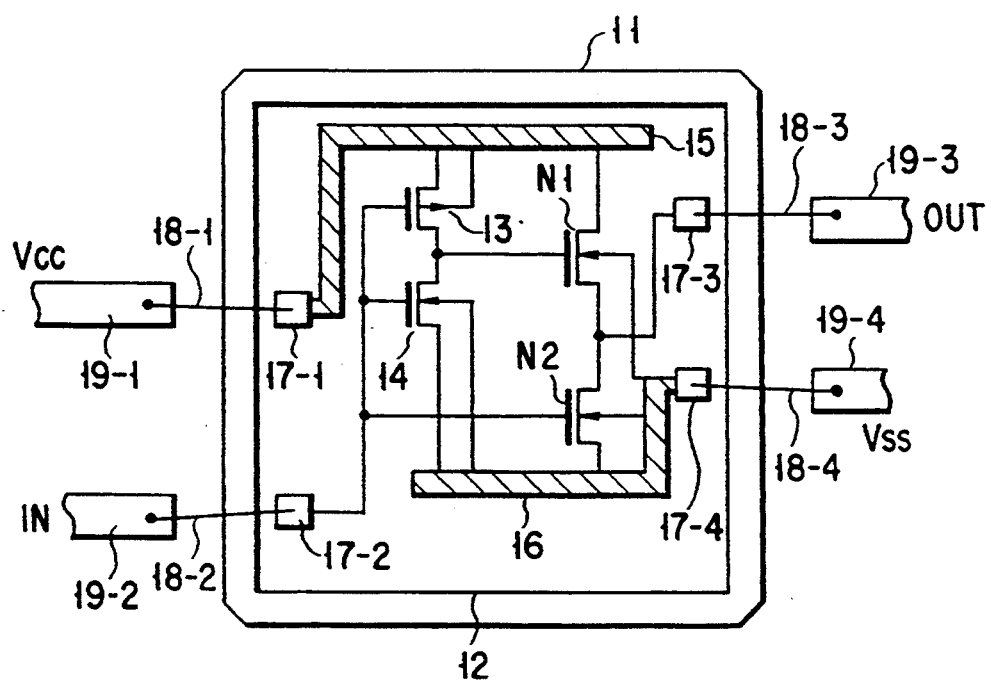
FIG. 2 is a plan view for illustrating the layout obtained when the circuit of FIG. 1 is formed in a semiconductor integrated circuit and set in a package.
Figure 3:
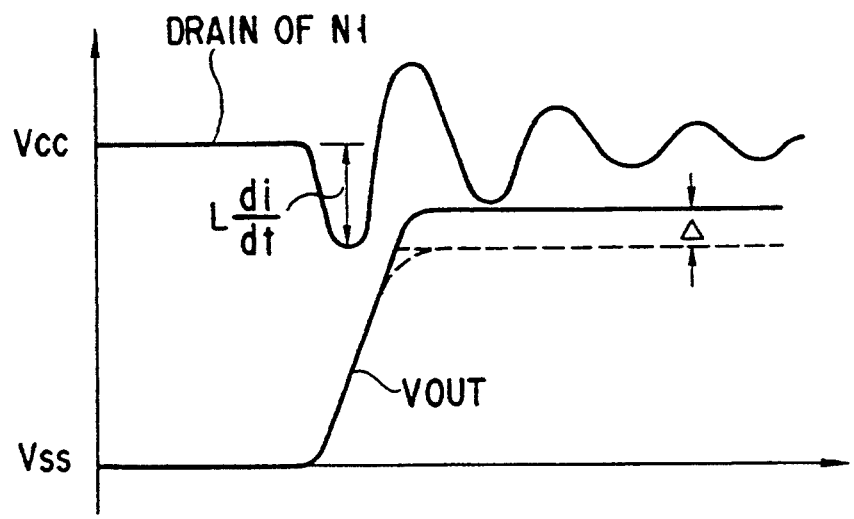
FIG. 3 is a waveform diagram of an output signal obtained when the circuit of FIG. 1 is formed with the layout shown in FIG. 2.

FIG. 4 shows a level shifting circuit according to a first embodiment of this invention. In the level shifting circuit of FIG. 4, the drain-source path of an N-channel MOS transistor N1 is connected between a power source node applied with a positive-side power source voltage Vcc1 and an output terminal and the drain-source path of an N-channel MOS transistor N2 is connected between the output terminal and a power source node applied with a ground voltage Vss. The gate of the N-channel MOS transistor N2 is supplied with an input signal IN and the gate of the N-channel MOS transistor N1 is supplied with a signal obtained by inverting the input signal IN by means of a CMOS inverter INV1.

The inverter INV1 is connected to a power source node applied with a positive-side power source voltage Vcc2 and a power source node applied with a ground voltage Vss and is supplied with the voltage Vcc2 different and independent from the voltage Vcc1 applied to the drain of the N-channel MOS transistor N1 as the positive-side power source voltage. The power source voltages Vcc1 and Vcc2 may be supplied entirely different power sources or supplied from the same power source via corresponding paths whose coupling degree is small.

The power source voltages Vcc1 and Vcc2 are so set as to satisfy the relation "Vcc1≧Vcc2". Further, like the conventional case, the MOS transistors N1 and N2 are of enhancement type.

In the level shifting circuit with the above construction, assume that an output signal voltage VOUT is set at the "L" level in the initial state in which the input signal voltage VIN is set at the "H" level. At this time, a signal on the output node of the inverter INV1 is set at the "L" level and the MOS transistors N1 and N2 are respectively set in the OFF and ON states. Therefore, the output signal OUT is set at the "L" level.

Next, when VIN is switched from the "H" level to the "L" level, the conduction state of the MOS transistor N1 is changed from the OFF state to the ON state and the conduction state of the MOS transistor N2 is changed from the ON state to the OFF state. As a result, a current for driving a load (not shown) connected to the output terminal flows in the MOS transistor N1. At this time, a potential bounce L(di/dt) occurs in the node of the drain of the MOS transistor N1, that is, Vcc line by the current variation rate di/dt and an inductance component L associated with the power source line of Vcc1 in the same manner as in the conventional case.

However, in this embodiment, the power source voltage Vcc2 supplied to the inverter INV1 is supplied from a power source different from that for Vcc1 or supplied from the same power source via one of different paths having a small coupling degree. Therefore, a potential bounce occurring in the Vcc1 line is not transmitted to the Vcc2 line. That is, even if the voltage Vcc1 has fluctuated, the voltage Vcc2 is kept unchanged. Further, even when a potential bounce occurs, a variation in Vcc2 can be made smaller than a variation in Vcc1 since the coupling degree is small. Therefore, an output potential of the inverter INV1 can be kept constant and the output amplitude at the output terminal is kept at a constant level "Vcc2-VthN1". Even if the output amplitude is set higher than the above level, the amount of variation is smaller than in the conventional case.

That is, in the circuit of this embodiment, even if a ringing phenomenon occurs in the power source voltage Vcc1, the power source voltage Vcc2 does not receive or becomes difficult to receive the influence so as to suppress the overshoot of the output. As a result, the output amplitude can be stably suppressed.

In the above embodiment, an example of means for making the degree of coupling of the power source voltages Vcc1 and Vcc2 small can be easily attained by providing a Vcc supply lead which is formed in the semiconductor integrated circuit as a common outer lead in an area outside the semiconductor integrated circuit and providing the same as two separated inner leads in an area inside the semiconductor integrated circuit. FIG. 5 is a plan view showing the pattern of the inner lead and the semiconductor integrated circuit (chip) thus constructed. An integrated circuit chip 22 containing the level shifting circuit of FIG. 4 is sealed in a package 21 of the semiconductor integrated circuit. Pads 23 and 24 for application of the power source voltages Vcc1 and Vcc2 are formed on the chip 22. Inner leads 25 are used for inputting, outputting or inputting/outputting signals, and inner leads 26A and 26B are used for application of the power source voltages Vcc1 and Vcc2. The inner leads 26A and 26B are connected to the common outer lead in an area outside the package 21 and separated at the boundary portion of the package and disposed to separately extend to the periphery of the chip 22 in an area inside the package. Then, the inner leads are electrically connected to pads 23 and 24 for application of Vcc1 and Vcc2 via bonding wires 27-1 and 27-2 in the peripheral portion of the chip.

Figure 5A:
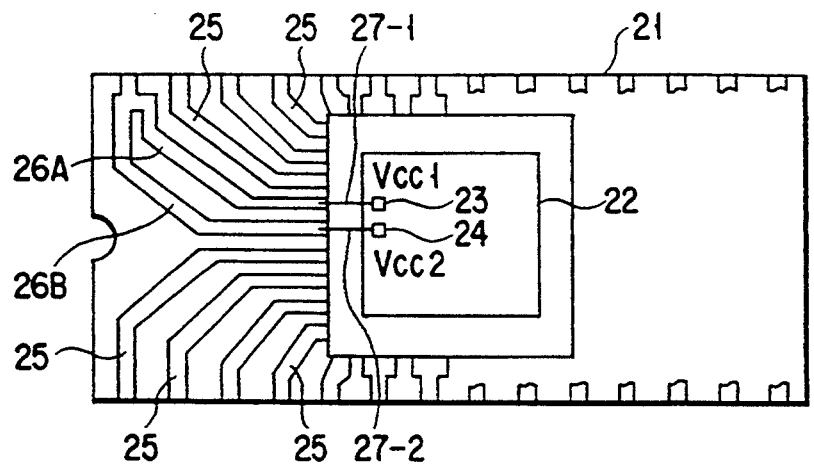
FIGS. 5A to 5E are pattern plan views of a chip and lead frame obtained when the circuit of FIG. 4 is formed in a semiconductor integrated circuit.
Figure 5B:
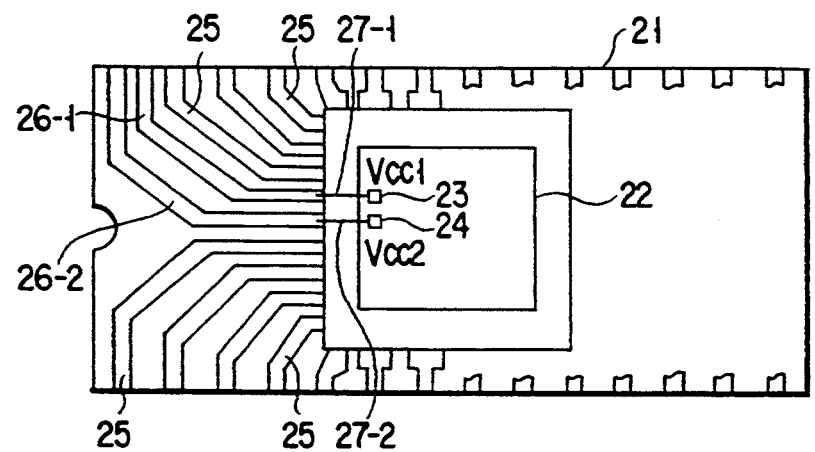
Figure 5C:
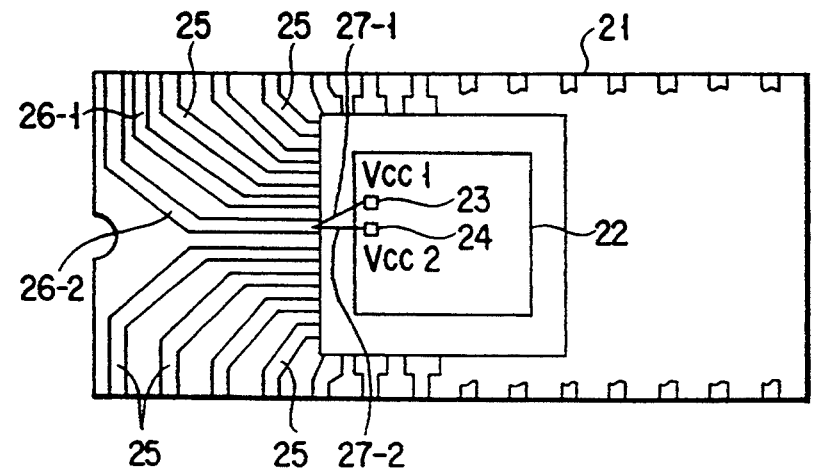
Figure 5D:
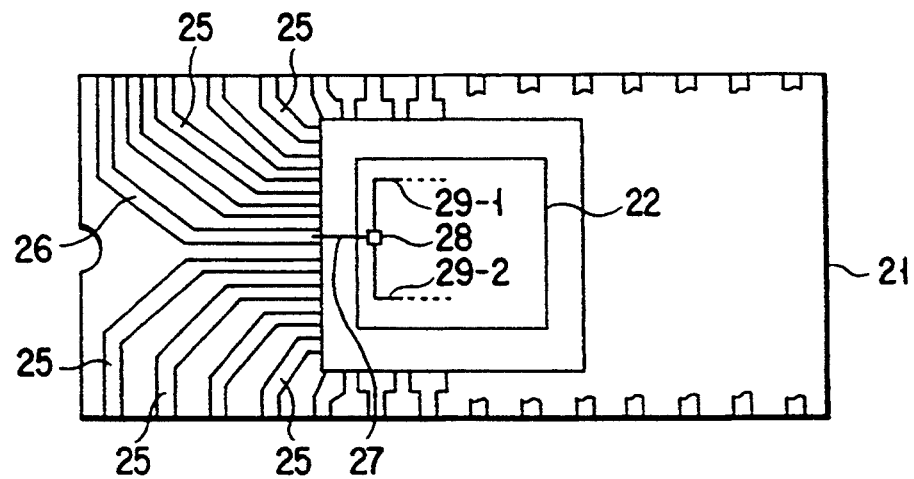

As shown in FIG. 5B, the inner leads 26-1 and 26-2 may be arranged to extend to the exterior of the package 21 as they are and used as independent outer leads (external pins) for Vcc1 and Vcc2. Further, as another example, one inner lead 26 for Vcc is provided, and two pads 23 and 24 for Vcc1 and Vcc2 are provided, and the one inner lead 26 may be electrically connected to the pads 23 and 24 via respective bonding wires 27-1 and 27-2 as shown in FIG. 5C. As shown in FIG. 5D, it is also possible to provide a single pad 28 for Vcc1 and Vcc2 and lead out two power source lines 29-1 and 29-2 for Vcc1 and Vcc2 from the single pad 28 in the chip 22.

Figure 5E:
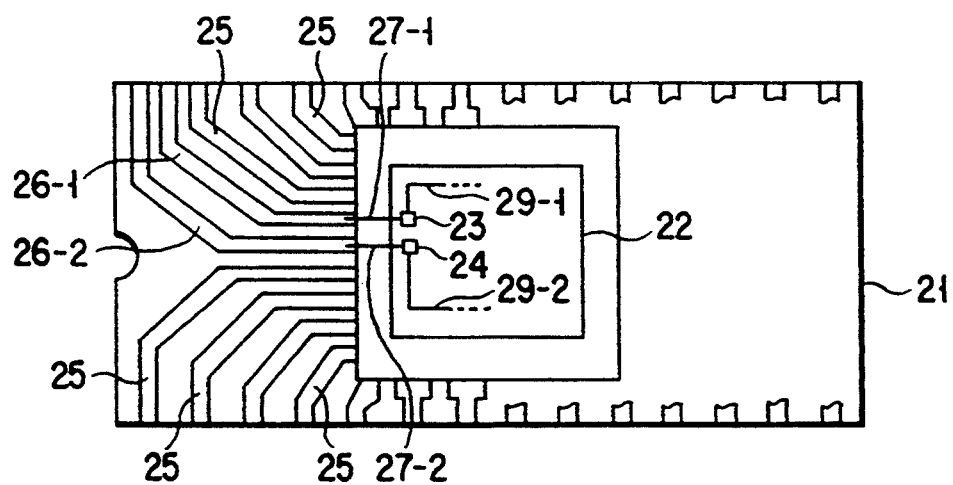

Further, as shown in FIG. 5E, completely different two external pins 26-1 and 26-2 (inner lead and outer lead) are provided and pads 23 and 24 for independent power source voltages Vcc1 and Vcc2 and power source lines 29-1 and 29-2 are provided on the chip 22, and the two inner leads 26-1 and 26-2 may be electrically connected to the two pads 23 and 24 via the independent boding wires 27-1 and 27-2, respectively.

Next, various modifications of the circuit of the embodiment shown in FIG. 4 are explained with reference to FIGS. 6 to 9, 10A, 10B, 11A, 11B, 12A, 12B and 13. In each of the circuits of the respective modifications, portions which are the same as those of FIG. 4 are denoted by the same reference numerals and the explanation is made by use of the reference numerals.

In the circuit of a modification shown in FIG. 6, an N-channel MOS transistor N3 having a source-drain path connected between the back gate (substrate) of the MOS transistor N1 and the output terminal is additionally provided. The gate of the MOS transistor N3 is connected to a node of power source voltage Vcc1.

In the circuit of a modification shown in FIG. 6, the source potential of the MOS transistor N3 which is connected to the back gate of the MOS transistor N1 is set to the ground potential when the output signal OUT is set at the ground potential and the source potential rises when the potential of the output signal OUT rises. However, the source potential is not set to exactly the same potential as the output signal potential but follows a potential which is set slightly lower than the output signal potential by the back-gate bias effect.

When the input signal IN is set at the "H" level, the MOS transistors N2 and N1 are respectively turned on and off so that the signal potential of the output terminal may be set to the ground potential. When the input signal IN is set at the "L" level, the MOS transistors N2 and N1 are respectively turned off and on. At this time, the signal potential of the output terminal rises at the initial stage even though the back-gate bias effect of the MOS transistor N2 is present. Therefore, the source potential of the MOS transistor N3 also rises. With an increase in the source potential, the degree of the back-gate bias effect becomes smaller, thereby causing the output potential to be further raised. The above operation is repeatedly effected, and when a balanced state is set up, an increase in the potential of the output signal is stopped.

In the case of the circuit of the above modification, the source potential of the MOS transistor N3 is raised according to the potential of the output signal on the output terminal, and in this case, since the back-gate bias effect of the MOS transistor N1 is reduced, the potential of the signal on the output terminal is raised to a higher level in comparison with the case of FIG. 4.

The circuit of a modification shown in FIG. 7 can be obtained by connecting the back gate of the MOS transistor N3 to the source of the MOS transistor N3. With this construction, the back-gate bias effect of the MOS transistor N3 is reduced and therefore the potential of the signal on the output terminal is raised to a higher level in comparison with the case of FIG. 4.

In the circuit of a modification shown in FIG. 8, an N-channel MOS transistor N4 is newly added, and when the MOS transistor N1 is turned off, the source potential of the MOS transistor N3 is stably set to the ground potential to stably turn off the MOS transistor N1. That is, the drain of the MOS transistor N4 is connected to the source of the MOS transistor N3 and the source thereof is grounded. The gate of the MOS transistor N4 is supplied with an input signal IN.

When the MOS transistor N1 is turned off, the potential of a signal on the output terminal becomes lower than the source potential of the MOS transistor N3 so that the MOS transistor N1 may effect the bipolar transistor operation and the MOS transistor N1 may become difficult to be turned off.

In the circuit of the modification shown in FIG. 8, when the input signal IN is set to the "H" level, the MOS transistor N4 is turned on to set the source potential of the MOS transistor N3 to the ground potential so that the MOS transistor N1 can be turned off without fail. In principle, the above object can be attained if only the inverter INV1 for creating a signal input to the gate of the MOS transistor N1 is formed of a circuit of Vcc2 system.

The circuit of a modification shown in FIG. 9 is a circuit in which the MOS transistor N1 of the circuit shown in FIG. 7 is stably turned off and is substantially the same as that of FIG. 8. Portions in FIG. 9 which are the same as those of FIGS. 7 and 8 are denoted by the same reference numerals and the explanation therefor is omitted.

The circuits of modifications shown in FIGS. 10A and 10B are constructed as an inverting circuit or non-inverting circuit by changing signals supplied to a node 2n of the gate of the MOS transistor N1 shown in FIG. 8 or 9, a node 8n of the gate of the MOS transistor N2, a node 5n of the gate of the MOS transistor N3 and a node 7n of the gate of the MOS transistor N4.

FIG. 11A shows an input circuit used when the circuits shown in FIGS. 10A and 10B are operated as inverting circuits. In the above input circuit, an input signal IN is supplied to the nodes 8n and 7n. Further, the input signal IN is supplied to the nodes 2n and 5n via an inverter INV2. Therefore, the input signal IN is inverted and output from the output terminals of the circuits shown in FIGS. 10A and 10B.

In the circuit of the above modification, the inverter INV2 for supplying a signal to the gate of the MOS transistor N1 is supplied with Vcc2 which is independent from Vcc1 as the power source voltage. Although not shown in the drawing, the ground voltage Vss is also supplied to the inverter INV2. Therefore, even if the power source voltage Vcc1 has fluctuated when the MOS transistor N1 is turned on, the voltage Vcc2 is not influenced and kept unchanged so that the output potential of the inverter INV2 can be kept constant and the output amplitude of a signal on the output terminal can be suppressed to a specified value. In principle, the object of this invention can be attained if only the inverter circuit for creating the signal 2n is formed of a circuit of Vcc2 system. This is also applied to the circuit of FIG. 11B.

FIG. 11B shows an input circuit used when the circuits shown in FIGS. 10A and 10B are operated as non-inverting circuits. In the above input circuit, Vcc2 which is independent from Vcc1 is supplied to a circuit 30 for generating an input signal IN as a positive-side power source voltage. The input signal IN is supplied to the nodes 2n and 5n. Further, the input signal IN is supplied to the nodes 7n and 8n via an inverter INV3. Therefore, the input signal IN is output from the output terminals of the circuits of FIGS. 10A and 10B without being inverted.

Figure 12A:
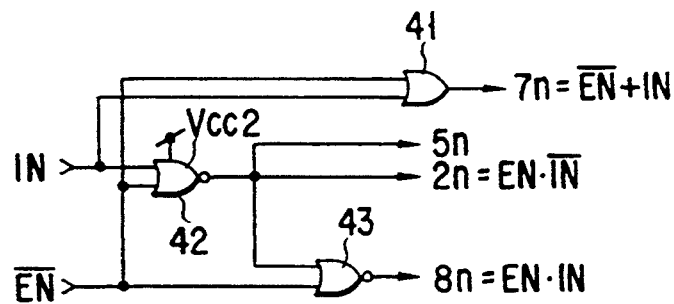
FIGS. 12A and 12B are circuit diagrams showing other examples of the constructions of input circuits used for the circuits shown in FIGS. 10A and 10B.

FIG. 12A shows an input circuit used when the circuits shown in FIGS. 10A and 10B are operated as inverting tri-state circuits. An input signal IN and enable signal $\overline{EN}$ are supplied to an OR circuit 41 and a NOR circuit 42. An output signal of the OR circuit 41 is supplied to the node 7n and an output signal of the NOR circuit 42 is supplied to the nodes 5n and 2n. Further, a NOR circuit 43 is supplied with an output signal of the NOR circuit 42 together with the enable signal $\overline{EN}$. An output signal of the NOR circuit 43 is supplied to the node 8n. The NOR circuit 42 which supplies a signal to the gate of the MOS transistor N1 is supplied with Vcc2 which is independent from Vcc1 as the power source voltage.

Figure 12B:
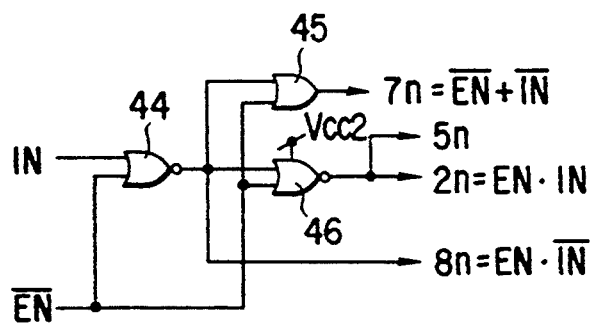

FIG. 12B shows an input circuit used when the circuits shown in FIGS. 10A and 10B are operated as non-inverting tri-state circuits. An input signal IN and enable signal $\overline{EN}$ are supplied to a NOR circuit 44. An output signal of the NOR circuit 44 is supplied to the node 8n. Further, an output signal of the NOR circuit 44 is supplied together with the enable signal $\overline{EN}$ to an OR circuit 45 and NOR circuit 46. An output signal of the OR circuit 45 is supplied to the node 7n and an output signal of the NOR circuit 46 is supplied to the nodes 5n and 2n. Also, in this case, the NOR circuit 42 which supplies a signal to the gate of the MOS transistor N1 is supplied with Vcc2 which is independent from Vcc1 as the power source voltage. The object of this invention can be attained if only the NOR circuit 46 for creating the signal 2n is formed of a circuit of Vcc2 system.

Figure 13:
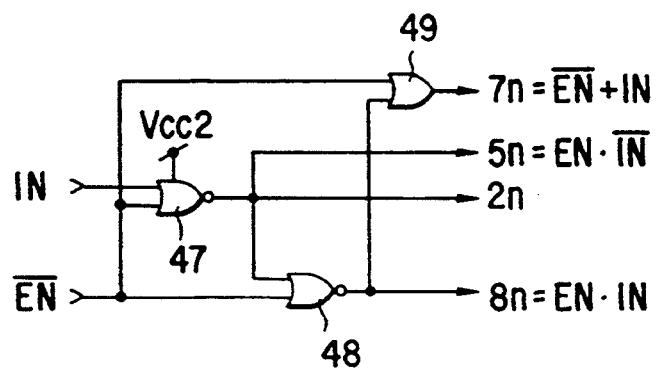
FIG. 13 is a circuit diagram showing still another example of the construction of an input circuit used for the circuits shown in FIGS. 10A and 10B.

FIG. 13 shows the construction of an input circuit used when the circuits shown in FIGS. 10A and 10B are operated as inverting tri-state circuits. An input signal IN and enable signal $\overline{EN}$ are supplied to a NOR circuit 47. An output signal of the NOR circuit 47 is supplied to the nodes 5n and 2n. Further, an output signal of the NOR circuit 47 is supplied together with the enable signal $\overline{EN}$ to a NOR circuit 48. In addition, an output signal of the NOR circuit 48 is supplied together with the enable signal $\overline{EN}$ to an OR circuit 49. An output signal of the OR circuit 49 is supplied to the node 7n and an output signal of the NOR circuit 48 is supplied to the node 8n.

Also, in this case, the NOR circuit 47 which supplies a signal to the gate of the MOS transistor N1 is supplied with Vcc2 which is independent from Vcc1 as the power source voltage. The object of this invention can be attained if only the NOR circuit 47 for creating the signal 2n is formed of a circuit of Vcc2 system.

In each of the above modified circuits, the logic circuit such as the inverter or NOR circuit for supplying a gate driving signal to the N-channel MOS transistor N1 which is set into the ON state when the potential of the output terminal is set to the "H" level is supplied with Vcc2 which is independent from Vcc1 as the power source voltage. Therefore, like the case of the circuit of the former embodiment of FIG. 4, a potential bounce occurring on the Vcc1 line does not appear on the Vcc2 line, and therefore, even when a ringing phenomenon occurs in Vcc1, Vcc2 will not be influenced by the ringing phenomenon, thereby making it possible to suppress the overshoot of the output.

FIG. 14 shows a level shifting circuit according to the second embodiment of this invention.

The circuit of this embodiment includes two N-channel MOS transistors N1 and N2 and one P-channel MOS transistor P1. The gate of the MOS transistor N1 is connected to a node of Vcc2 which is independent from Vcc1 so as to prevent an output from being influenced by a potential bounce occurring on the Vcc1 line.

Next, various modifications of the circuit of the embodiment shown in FIG. 14 are explained with reference to FIGS. 15A, 15B, 16A, 16B, 17, 18A, 18B, 19A and 19B. In each of the circuits of the respective modifications, portions which are the same as those of FIG. 14 are denoted by the same reference numerals and the explanation is made by use of the reference numerals.

The circuits of the modifications shown in FIGS. 15A and 15B may function as an inverting or non-inverting circuit according to the relation between signals supplied to nodes 7n, 5n, 9p and 8n with the gate of a MOS transistor N1 connected to a node of the power source Vcc2. That is, in the circuits of FIGS. 15A and 15B, the gate of the MOS transistor N1 is connected to the node of the power source Vcc2. The drain of the MOS transistor N1 is connected to the drain of a P-channel MOS transistor P1. The back gate of the MOS transistor P1 is connected to the source thereof and a node of the power source Vcc1. The gate of the MOS transistor P1 is connected to a node 9n. Further, like the circuits of the modifications shown in FIGS. 10A and 10B, N-channel MOS transistors N3 and N4 are additionally provided.

In the circuits of the above modifications, a higher potential can be derived from the output terminal when the MOS transistor N1 is formed of depletion type. Further, since the P-channel MOS transistor P1 is series-connected with the MOS transistor N1, flow of a D.C. through current can be prevented.

In order to suppress the amplitude of an output potential of the output terminal, the threshold voltage of the MOS transistor N1 may be set to a higher voltage level or the threshold voltage of the MOS transistor N3 may be enhanced. Alternatively, the potential of the node 5n may be set to a lower potential level.

FIG. 16A shows an input circuit used when the circuits shown in FIGS. 15A and 15B are operated as inverting circuits. In the above input circuit, an input signal IN is supplied to the nodes 7n, 8n and 9n. Further, the input signal IN is supplied to the node 5n via an inverter INV4. The inverter INV4 is supplied with Vcc1 as the positive-side power source voltage.

FIG. 16B shows an input circuit used when the circuits shown in FIGS. 15A and 15B are operated as inverting circuits. In the above input circuit, the node 5n is connected to the node of the power source Vcc1 and an input signal IN is supplied to the nodes 7n, 8n and 9n.

FIG. 17 shows an input circuit used when the circuits shown in FIGS. 15A and 15B are operated as non-inverting tri-state circuits. An input signal IN and enable signal EN are supplied to an AND circuit 51 and a NAND circuit 52. An output signal of the AND circuit 51 is supplied to the node 5n and an output signal of the NAND circuit 52 is supplied to the nodes 9p and 7n. Further, the enable signal EN is supplied to a NOR circuit 53 via an inverter INV5 as one of the inputs thereof and the input signal IN is supplied to the other input of the NOR circuit 53. An output signal of the NOR circuit 53 is supplied to the node 8n.

The circuits of the modifications shown in FIGS. 18A and 18B are obtained by modifying the circuits of FIGS. 15A and 15B so as to permit the operation thereof to be controlled by a clock signal.

That is, in FIGS. 18A and 18B, the drain of the MOS transistor N1 is connected to the drain of the P-channel MOS transistor P1. The back gate of the MOS transistor P1 is connected to the source thereof and a node of the power source Vcc1. The gate of the MOS transistor P1 connected to a node 20p. Further, the source of the MOS transistor N2 is connected to the drain of an N-channel MOS transistor N5. The back gate of the MOS transistor N5 is connected to the source thereof. The gate of the MOS transistor N5 is connected to a node 20n.

FIGS. 19A and 19B show input circuits for controlling the circuits of the modifications shown in FIGS. 18A and 18B by a clock signal.

In FIG. 19A, an input signal IN is supplied to the nodes 20p and 20n. A clock signal $\phi$ supplied to the node 7n and supplied to the nodes 5n, 2n and 8n via an inverter INV6 which is supplied with the power source voltage Vcc2. Thus, an erroneous operation caused by a difference between the clock signals $\phi$ and $\overline{\phi}$ an be prevented by supplying a clock signal to the nodes 2n and 8n of the MOS transistors N1 and N2 and supplying the input signal IN to the MOS transistors P1 and N5. In principle, the object of this invention can be attained if only the inverter INV6 for creating the signal 2n is formed of a circuit of Vcc2 system.

In FIG. 19B, an input signal IN is supplied to the nodes 7n and 8n and supplied to the nodes 5n and 2n via an inverter INV7 which is supplied with the power source voltage Vcc2. A clock signal $\phi$ is supplied to the node 20n and supplied to the node 20p via an inverter INV8 which is supplied with the power source voltage Vcc1 (not shown). In principle, the object of this invention can be attained if only the inverter INV7 for creating the signal 2n is formed of a circuit of Vcc2 system.

If the MOS transistors N2 and N5 are removed from the circuits of FIGS. 18A and 18B, open drain type clocked pull-up circuits can be obtained.

FIGS. 20A, 20B, 21A, 21B, 22A, 22B and 23 show circuits of other modifications of the circuit of the first embodiment shown in FIG. 4. That is, the circuit of the embodiment shown in FIG. 4 is constructed by the N-channel MOS transistors, but in the circuits of the above modifications, P-channel MOS transistors are used instead of the N-channel MOS transistors. The circuits of the above modifications respectively correspond to the circuits shown in FIGS. 10A, 10B, 11A, 11B, 12A, 12B and 13, and portions which correspond to those of FIGS. 10A, 10B, 11A, 11B, 12A, 12B and 13 are denoted by corresponding reference symbols with letters n attached thereto replaced by letters p. Further, the circuits shown in FIGS. 20A and 20B may be operated as an inverting circuit or non-inverting circuit according to signals supplied to the nodes 8p, 2p, 5p and 7p.

In the circuit of FIG. 20A, the source-drain paths of P-channel MOS transistors P12 and P11 are series-connected between a node of the power source voltage Vcc and a node of the ground voltage Vss1. The back gate of the MOS transistor P12 is connected to the source thereof and the gate thereof is connected to the node 8p. Further, the drain of the MOS transistor P12 is connected to the output terminal. The gate of the MOS transistor P11 is connected to the node 2p and the source thereof is connected to the source of the MOS transistor P13. The back gate of the MOS transistor P13 is connected to a node of the power source voltage Vcc and the gate thereof is connected to the node 5p. Further, the drain of the MOS transistor P13 is connected to the back gate of the MOS transistor P11 and the drain of a P-channel MOS transistor P14. The source and back gate of the MOS transistor P14 are connected to the node of the power source voltage Vcc and the gate thereof is connected to the node 7p.

The circuit of FIG. 20B is formed with substantially the same construction as the circuit of FIG. 20A except that the back gate of the MOS transistor P13 is connected to the drain thereof instead of the node of the power source voltage Vcc. In the circuits of FIGS. 20A and 20B, an output voltage of further lowered level can be obtained by forming the MOS transistor P11 by use of a depletion type MOS transistor. In this case, however, a through current will flow.

The circuits of FIGS. 20A and 20B are operated as an inverter circuit or non-inverting circuit according to signals supplied to the nodes 8p, 2p, 5p and 7p.

FIG. 21A shows an input circuit used when the circuits of FIGS. 20A and 20B are operated as an inverting circuit. In the input circuit, an input signal IN is supplied to the nodes 8p and 7p. Further, the input signal IN is supplied to the nodes 2p and 5p via an inverter INV9. Therefore, the input signal IN is inverted and output from the output terminals of the circuits shown in FIGS. 20A and 20B.

A voltage Vss2 (Vss2≧Vss1) which is independent from Vss1 supplied to the drain of the MOS transistor P11 is supplied to the inverter INV9 as a ground voltage. In principle, the object of this invention can be attained if only the inverter INV9 for creating the signal 2p is formed of a circuit of Vss2 system.

FIG. 21B shows an input circuit used when the circuits of FIGS. 20A and 20B are operated as a non-inverting circuit. In the input circuit, a circuit 31 for generating an input signal IN is supplied with Vss2 which is independent from Vss1 as the ground voltage. The input signal IN is supplied to the nodes 2p and 5p. Further, the input signal IN is supplied to the nodes 7p and 8p via an inverter INV10. Therefore, the input signal IN is output from the output terminals of the circuits of FIGS. 20A and 20B without being inverted. In principle, the object of this invention can be attained if only the inverter INV10 for creating the signal 2p is formed of a circuit of Vss2 system.

FIG. 22A shows an input circuit used when the circuits of FIGS. 20A and 20B are operated as an inverting tri-state circuit. An input signal IN and enable signal EN are supplied to a NAND circuit 53 and AND circuit 54. An output signal of the NAND circuit 54 is supplied to the node 7p and an output signal of the NAND circuit 53 is supplied to the nodes 5p and 2p. Further, an output signal of the NAND circuit 53 is supplied together with the enable signal EN to a NAND circuit 55. An output signal of the NAND circuit 55 is supplied to the node 8p. The NAND circuit 53 is supplied with Vss2 which is independent from Vss1 as the ground voltage. In principle, the object of this invention can be attained if only the NAND circuit 53 for creating the signal 2p is formed of a circuit of Vss2 system.

FIG. 22B shows an input circuit used when the circuits of FIGS. 20A and 20B are operated as a non-inverting tri-state circuit. An input signal IN and enable signal EN are supplied to a NAND circuit 56. An output signal of the NAND circuit 56 is supplied to the node 8p. Further, the output signal of the NAND circuit 56 is supplied together with the enable signal EN to a NAND circuit 57 and AND circuit 58. An output of the NAND circuit 58 is supplied to the node 7p and an output signal of the NAND circuit 57 is supplied to the nodes 5p and 2p. The NAND circuit 57 is supplied with Vss2 which is independent from Vss1 as the ground voltage. Also, in this case, the object of this invention can be attained if only the NAND circuit 57 for creating the signal 2p is formed of a circuit of Vss2 system.

FIG. 23 shows another example of an input circuit used when the circuits of FIGS. 20A and 20B are operated as an inverting tri-state circuit. An input signal IN and enable signal EN are supplied to a NAND circuit 59. An output signal of the NAND circuit 59 is supplied to the nodes 5p and 2p. Further, the output signal of the NAND circuit 59 is supplied together with the enable signal EN to a NAND circuit 60. An output of the NAND circuit 60 is supplied to the node 8p and supplied together with the enable signal EN to an AND circuit 61. Further, an output signal of the AND circuit 61 is supplied to the node 7p. The NAND circuit 59 is supplied with Vss2 which is independent from Vss1 as the ground voltage. In principle, the object of this invention can be attained if only the NAND circuit 59 for creating the signal 2p is formed of a circuit of Vss2 system.

In the circuits of the modifications shown in FIGS. 20A, 20B, 21A, 21B, 22A, 22B and 23, when the P-channel MOS transistor P11 is turned on and an output signal OUT is changed from the "H" level to the "L" level, the undershoot occurs in the ground voltage Vss1. However, a potential bounce which may occur in the Vss1 line will not occur in the Vss2 line, and even if a ringing phenomenon occurs in Vss1, Vss2 will not be influenced by the ringing phenomenon. Therefore, in the circuits of the above modifications, the undershoot of the output can be suppressed. In principle, if the degree of coupling between Vss1 and Vss2 is made small like the relation between Vcc1 and Vcc2, the object of this invention can be attained.

FIGS. 24A, 24B, 25A, 25B, 26, 27A, 27B, 28A and 28B show circuits of other modifications of the circuit according to the second embodiment shown in FIG. 14. That is, in the circuit of the second embodiment shown in FIG. 14, the overshoot of the output is suppressed by using two power source systems of Vcc1 and Vcc2 as the positive-side power source voltage, but in the above modifications, the undershoot of the output is suppressed as in the case of the circuits of the modifications shown in FIGS. 20A, 20B, 21A, 21B, 22A, 22B and 23. The circuits of the above modifications correspond to the circuits shown in FIGS. 15A, 15B, 16A, 16B, 17, 18A, 18B, 19A and 19B, and therefore, portions of the above circuits corresponding to those of the circuits shown in FIGS. 15A, 15B, 16A, 16B, 17, 18A, 18B, 19A and 19B are denoted by corresponding reference symbols with letters n and p attached thereto replaced by respective letters p and n. The circuits of FIGS. 24A, 24B, 27A and 27B may be operated as an inverting circuit or non-inverting circuit according to signals supplied to the nodes 8p, 2p, 5p and 7p.

The circuits of the modifications shown in FIGS. 24A and 24B are operated as an inverting or non-inverting circuit according to the relation between the potentials of the nodes with the gate of the MOS transistor P21 supplied with the ground voltage Vss2. That is, in FIGS. 24A and 24B, the gate of the MOS transistor P21 is connected to the node of voltage Vss2. The drain of the MOS transistor P21 is connected to the drain of an N-channel MOS transistor N11. The back gate of the MOS transistor N11 is connected to the source thereof and a node of the ground voltage Vss1. The gate of the MOS transistor N11 is connected to a node 9n. Further, the source-drain path of a P-channel MOS transistor P23 is connected between the output terminal and the back gate of a P-channel MOS transistor P21 and the gate of the MOS transistor P23 is connected to a node 5p. The source-drain path of a P-channel MOS transistor P24 is connected between a node of the power source voltage Vcc and the back gate of the P-channel MOS transistor P21 and the gate of the MOS transistor P24 is connected to a node 7p.

If the MOS transistor P21 is formed of depletion type in the above circuits, a lower potential is derived from the output terminal. In addition, since the N-channel MOS transistor N11 is series-connected with the MOS transistor P21, a D.C. through current will not flow.

In order to suppress the amplitude of the signal potential output from the output terminal, the threshold voltage of the MOS transistor P21 may be enhanced or the threshold voltage of the MOS transistor P23 may be enhanced. Alternatively, the potential of the node 5p may be enhanced.

FIG. 25A shows an input circuit used when the circuits shown in FIGS. 24A and 24B are operated as inverting circuits. In the above input circuit, an input signal IN is supplied to the nodes 7p, 8p and 9n. Further, the input signal IN is supplied to the node 5p via an inverter INV11.

FIG. 25B shows an input circuit used when the circuits shown in FIGS. 24A and 24B are operated as inverting circuits. In the above input circuit, the node 5p is connected to the node of the ground voltage Vss1 and an input signal IN is supplied to the nodes 7p, 8p and 9n.

FIG. 26 shows an input circuit used when the circuits shown in FIGS. 24A and 24B are operated as non-inverting tri-state circuits. An input signal IN and enable signal EN are supplied to a NAND circuit 62. An output signal of the NAND circuit 62 is supplied to the node 8p. Further, the enable signal EN is supplied to one input terminal of a NOR circuit 63 via an inverter INV12. The input signal IN is supplied to the other input terminal of the NOR circuit 63. An output signal of the NOR circuit 63 is supplied to nodes 9n and 7p. Further, the input signal IN and an output signal of the inverter INV12 are supplied to an OR circuit 64 and an output signal of the OR circuit 64 is supplied to a node 5p.

The circuits of the modifications shown in FIGS. 27A and 27B are obtained by modifying the circuits of FIGS. 24A and 24B so as to permit the operation thereof to be controlled by a clock signal.

That is, in FIGS. 27A and 27B, the drain of the MOS transistor P21 is connected to the drain of the N-channel MOS transistor N11. The back gate of the MOS transistor N11 is connected to the source thereof and a node of the ground voltage Vss1. The gate of the MOS transistor N11 is connected to a node 20n. Further, the source of the MOS transistor P22 is connected to the drain of a P-channel MOS transistor P25. The back gate of the MOS transistor P25 is connected to the source thereof and the back gate of the MOS transistor P22. The gate of the MOS transistor P25 is connected to a node 20p.

FIGS. 28A and 28B show input circuits for controlling the circuits shown in FIGS. 27A and 27B by a clock signal.

In FIG. 28A, an input signal IN is supplied to the nodes 20p and 20n. A clock signal φ is supplied to the node 7p and supplied to the nodes 5p, 2p and 8p via an inverter INV13. The inverter INV13 is supplied with Vss2 which is independent from Vss1 as the ground voltage. In principle, the object of this invention can be attained if only the inverter INV13 for creating the signal 2p is formed of a circuit of Vss2 system.

Thus, an erroneous operation caused by a phase difference between the clock signals φ and $\bar{\phi}$ can be prevented by supplying a clock signal φ to the nodes 2p, 5p and 8p of the gates of the MOS transistors P21, P22 and P23 and supplying the input signal IN to the gates of the MOS transistors P25 and N11. In this case, it is assumed that the input signal IN is transferred to the output terminal in synchronism with the rise of the clock signal φ.

In FIG. 28B, an input signal IN is supplied to the nodes 7p and 8p and supplied to the nodes 2p and 5p via an inverter INV14. A clock signal $\bar{\phi}$ is supplied to the node 20p and supplied to the node 20n via an inverter INV15. Also, in this case, the object of this invention can be attained if only the inverter INV14 for creating the signal 2p is formed of a circuit of Vss2 system.

If the MOS transistors P22 and P25 are removed from the circuits of FIGS. 27A and 27B, open drain type clocked pull-down circuits can be obtained.

This invention is not limited to the above embodiments and can be variously modified without departing from the technical scope thereof.

As described above, according to this invention, a level shifting circuit capable of suppressing the overshoot and undershoot of the output and stably suppressing the output amplitude can be provided.

What is claimed is:

1. A level shifting circuit comprising:
    a first MOS transistor which has a current path connected between a first power source node supplied with a first power source voltage and an output terminal and whose conduction state is controlled according to a first signal;
    a second MOS transistor which has a current path connected between a second power source node supplied with a second power source voltage and said output terminal, which is of the same channel type as said first MOS transistor and whose conduction state is controlled according to a second signal;
    logic means supplied with one of the first and second power source voltages as one power source voltage and a third power source voltage independent from the first and second voltages as the other power source voltage, for creating the second signal based on the first signal; and
    a third MOS transistor having a current path connected at one end to said output terminal and connected at the other end to the back gate of said second MOS transistor and having the same channel type as said second MOS transistor.

2. A level shifting circuit according to claim 1, wherein a back gate of said third MOS transistor is connected to the back gate of said second MOS transistor.

3. A level shifting circuit comprising:
    a first MOS transistor of first channel type which has a current path connected between a first power source node supplied with a first power source voltage and an output terminal and whose conduction state is controlled according to a first input signal;
    a second MOS transistor of a second channel type which has a current path connected at one end to a second power source node supplied with a second power source voltage and whose conduction state is controlled according to a second input signal;
    a third MOS transistor of the first channel type having a current path connected between the other end of the current path of said second MOS transistor and said output terminal and a gate connected to a third power source node which is supplied with a third power source voltage independent from the second power source voltage;
    a fourth MOS transistor of the first channel type having a current path connected between a back gate of said third MOS transistor and said output terminal; and
    a fifth MOS transistor of the first channel type having a current path connected between said back gate of said third MOS transistor and said first power source node and a back gate connected to said first power source node and whose conduction is controlled according to a third input signal.

4. A level shifting circuit according to claims 1, 2 or 3, wherein said first, second and third power source voltages are supplied via respective leads provided in a semiconductor integrated circuit, said lead for supplying said third power source voltage and said lead for supplying said first or second power source voltage are separated from each other in an area inside said semiconductor integrated circuit and are integrally formed with each other in an area outside said semiconductor integrated circuit.

5. A level shifting circuit according to claims 1, 2 or 3, wherein said first, second and third power source voltages are supplied via respective leads provided in a semiconductor integrated circuit, said lead for supplying said third power source voltage is separated from said lead for supplying said first or second power source voltage in areas inside and outside said semiconductor integrated circuit.

6. A level shifting circuit according to claims 1 or 2, wherein said first and second MOS transistors are of N-channel type, said first power source voltage is a ground voltage, said second power source voltage is a positive side voltage and said third power source voltage is a positive side voltage.

7. A level shifting circuit according to claims 1 or 2, wherein said first and second MOS transistors are of P-channel type, said first power source voltage is a ground voltage, said second power source voltage is a positive side voltage and said third power source voltage is a ground voltage.

8. A level shifting circuit according to claim 3, wherein said first and third MOS transistors are of N-channel type, said second MOS transistor is of P-channel type, said first power source voltage is a ground voltage, said second power source voltage is a positive side voltage and said third power source voltage is a positive side voltage.

9. A level shifting circuit according to claim 3, wherein said first and third MOS transistors are of P-channel type, said second MOS transistor is of N-channel type, said first power source voltage is a ground voltage, said second power source voltage is a positive side voltage and said third power source voltage is a ground voltage.

* * * * *